United States Patent [19]

Iwasaki

[11] 4,454,553
[45] Jun. 12, 1984

[54] D.C. CURRENT DETECTOR

[75] Inventor: Shinichiro Iwasaki, Auburn Heights, Mich.

[73] Assignee: Aisin Seiki Company, Limited, Kariya, Japan

[21] Appl. No.: 363,399

[22] Filed: Mar. 29, 1982

Related U.S. Application Data

[63] Continuation of Ser. No. 182,699, Aug. 29, 1980, abandoned.

[51] Int. Cl.³ .............................................. H02H 7/08
[52] U.S. Cl. ................................. 361/31; 324/117 R
[58] Field of Search ............... 361/31, 93, 98; 363/20, 363/21; 323/351; 324/117 R, 127; 336/107, 234, 65

[56] References Cited

U.S. PATENT DOCUMENTS 3,818,337  6/1974  Groenenbroom et al. ...... 324/117 R X
3,855,528  12/1974  Brown ............................. 324/117 R
4,155,397  5/1979  Honsinger et al. ................ 164/5

Primary Examiner—Reinhard J. Eisenzopf
Attorney, Agent, or Firm—Oblon, Fisher, Spivak, McClelland & Maier

[57] ABSTRACT

A current detector comprising a current-pulse duty conversion element including a core of an amorphous, magnetically soft material having a first and a second coil disposed thereon. A current which is to be determined is passed through the first coil while the current flowing through the second coil is detected. A pulse of a given frequency is applied to one end of the second coil while the other end of the second coil is connected with an element which converts the current flowing through the second coil into a corresponding voltage. A voltage developed across the element is integrated and then converted into an analog voltage. The duty ratio of the voltage pulse appearing across the element which is connected to the other end of the second coil changes in accordance with the value of current passing through the first coil, whereby the analog voltage shifts.

3 Claims, 8 Drawing Figures

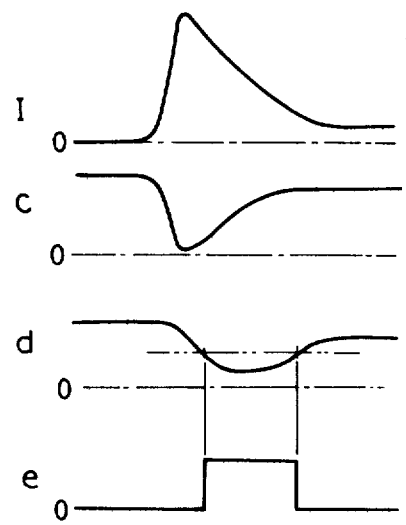
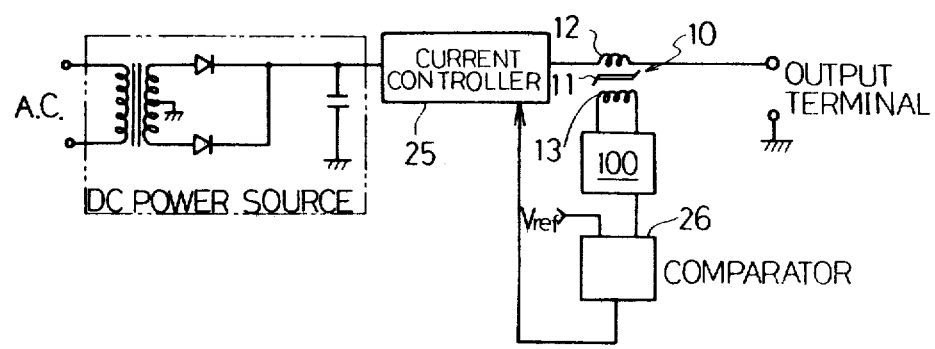

D.C. CURRENT DETECTOR

BACKGROUND OF THE INVENTION

1. Field of the Invention

The present invention relates in general to a novel D.C. current detector which produces an analog voltage corresponding to the magnitude of a D.C. current.

2. Description of the Prior Art

A D.C. current detection technique is usually utilized in which a D.C. current, flowing through a circuit, which is to be determined, hereafter referred to as a D.C. load current, is passed through a resistor to develop a voltage thereacross which is representative of the current. It will be appreciated that the resistor adds to the loading on the circuit through which the D.C. load current passes, causing a power loss of substantial magnitude. In particular, when the D.C. load current is relatively high, the power loss caused by the resistor has an increased value. To prevent a drift in the measuring circuit, the resistor must be connected to ground, which imposes a limitation on the location of the resistor associated with the sensor, thereby necessitating that the load be floated above ground. The interposition of the resistor may be difficult depending on the variety of the load equipment.

SUMMARY OF THE INVENTION

It is a first object of the present invention to provide a novel D.C. current detector which avoids the increased power loss in a D.C. load current circuit.

A second object of the present invention is to provide a novel D.C. current detector which permits a current sensor to be located anywhere in the D.C. load current circuit.

A third object of the present invention is to provide a novel D.C. current detector having a direct current detecting mechanism which can be designed for the measurement of both small and large currents.

A fourth object of the present invention is to provide a novel D.C. current detector which produces a current detection output with relatively low power dissipation irrespective of the level of the current being determined.

These and other objectives are achieved in accordance with the present invention by utilizing a current-pulse duty conversion element as a current sensor; the element including a core of an amorphous, magnetically soft material having a first coil through which the current to be determined is passed and a second coil to which a pulse is applied for purposes of current detection. A pulse supply circuit is connected to one end of the second coil in order to apply the pulse of a given frequency thereto while the other end of the second coil is connected with an element, hereafter referred to as a voltage conversion element, which converts the current flow through the coil into a corresponding voltage. The voltage conversion element is connected to an integrating circuit. A pulse having a duty ratio which depends on the level of a current flowing through the first coil appears at the voltage conversion element, and hence an output analog voltage of the integrating circuit exhibits a value which corresponds to the current flowing through the first coil. Since the first and the second coils are not connected with each other, the potential of the first coil with respect to ground has no influence on the second coil and its connected circuit. The second coil and its connected circuit can be connected to ground at any desired point. Accordingly, the first coil can be inserted anywhere in the D.C. load current circuit. The first coil has a low D.C. resistance, thereby minimizing the voltage developed thereacross and the power loss therein.

The amorphous, magnetically soft material is shaped into a thin sheet since it must be quenched from a liquid metal. Magnetically it exhibits high ferromagnetism, a high permeability ($u_{max} > 10^3$), a low magnitude of magnetic saturation, and a low coercive force ($< 1.0$ Oe). Mechanically, it has a very high fracture strength and excellent resiliency and stability. Such magnetically soft materials are described in Hasegawa et al, "Soft Magnetic Properties of Metallic Glasses-Recent Developments", J. Appl. Phys. 50(3), March, 1979, pp. 1551-1556. Magnetically soft materials are sold under the trademark METGLAS TM by Allied Chemical Corp.

The use of such amorphous, magnetically soft material for the core of the current-pulse duty conversion element facilitates the manufacture of the element, which exhibits a high resistance to oscillations and impact, thereby allowing it to be disposed close to an electric motor or an associated driver circuit in a vehicle. Of particular importance is the fact that the conversion element is adapted to detect a current of any desired level or range, with low power dissipation, by a suitable choice of the size of the core, the winding wire, and the number of turns.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6b is a series of timing charts illustrating various electrical signals appearing at various points in the motor load alarm circuit of FIG. 6a; and FIG. 7 is a block diagram of a load current control system incorporating the D.C. current detector of FIG. 1.

DESCRIPTION OF THE PREFERRED EMBODIMENTS

Figure 1:
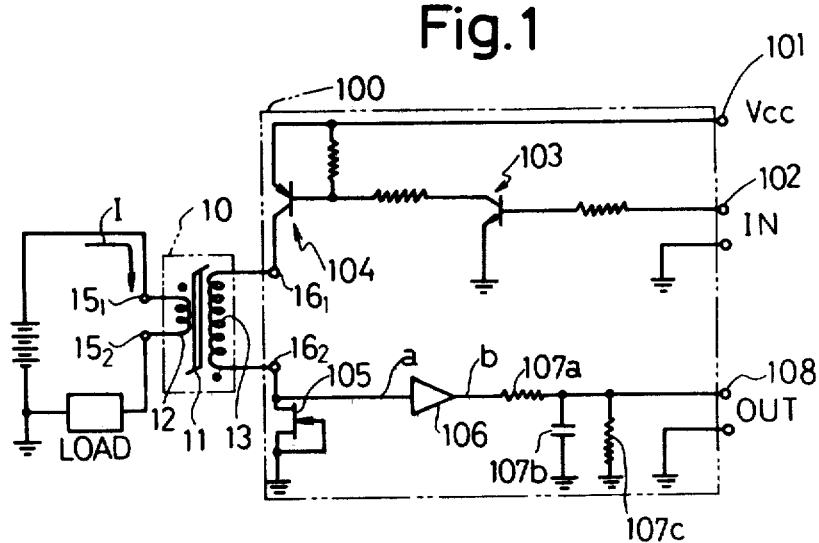
FIG. 1 is a circuit diagram of one embodiment of the present invention.

Referring now to the drawing, wherein like reference numerals designate identical or corresponding parts throughout the several views, and more particularly to FIG. 1 thereof, a first embodiment of the present invention is illustrated. The detector includes a current-pulse duty conversion element 10 including a core 11 made of an amorphous, magnetically soft material having a first coil 12 and a second coil 13 disposed thereon. The first coil 12 is connected in a circuit through which a D.C. load current I flows, while the opposite ends of the second coil 13 are connected to a current detection circuit 100.

Figures 2, 3:
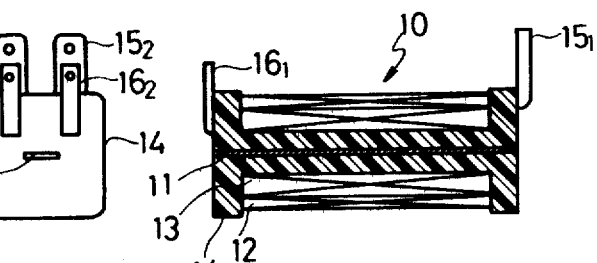
FIG. 2 is a longitudinal sectional view of the current-pulse duty conversion element shown in FIG. 1.
FIG. 3 is a left-hand side elevational view of the conversion element shown in FIG. 2.

Referring to FIGS. 2 and 3, the conversion element 10 includes coil bobbin 14 having an axial opening in which the core 11 is inserted. The first and the second coils 13, 12 are disposed on the bobbin 14. A pair of connection terminals $16_1$, $16_2$ are secured to the left-hand flange of the bobbin 14 and are connected with the opposite ends of the second coil 13, while another pair of connection terminals $15_1$, $15_2$ are secured to the right-hand flange of the bobbin 14 and are connected with the opposite ends of the first coil 12.

Figure 4:
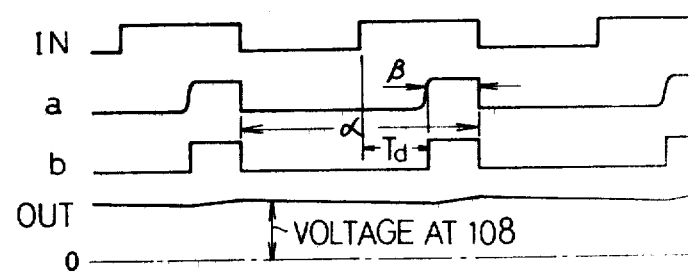
FIG. 4 is a series of timing charts illustrating various electrical signals appearing in the circuit of FIG. 1.

Referring to FIG. 1 again, the current detection circuit 100 includes an input terminal 101 to which a constant voltage Vcc is applied, and also includes a pulse input terminal 102 to which a pulse signal of a given frequency, such as, for example, 20 kHz, is applied. Transistors 103 and 104 are turned on during a positive level interval of the input pulse signal, whereby the voltage Vcc is applied to the terminal $16_1$. On the other hand, during the ground level or a negative level interval of the input pulse signal, both transistors 103, 104 are turned off. In other words, the voltage Vcc is applied to the terminal $16_1$ during the positive level interval of the input pulse (IN) in synchronism thereof while no voltage is applied to the terminal $16_1$ during the ground level or the negative level interval of the input pulse. A current flows through the second coil 13 with a time delay Td after the application of the voltage Vcc, which time delay corresponds to the value of the D.C. load current I. A constant current source, in the form of a field effect transistor 105, is connected to the terminal $16_2$ of the second coil 13. A pulse a of a positive level (see FIG. 4) appears at the terminal $16_2$ during the time the current flows through the second coil 13. The pulse a is amplified and shaped by an amplifier 106, and an output pulse b from the amplifier 106 is applied to an integrating circuit formed by a resistor 107a, a capacitor 107b, and a resistor 107c. An analog voltage in the form of an integrated voltage appears at an output terminal 108.

The inventor of the present invention has determined the analog voltage developed at the output terminal 108 for a varying value of I for the circuit shown in FIG. 1. The material and dimensions of the current-pulse duty conversion element 10 used are indicated in the Table 1 below, with data obtained shown in FIG. 5.

used in the core and increasing their width or by reducing the number of turns in the coil 12, a rapid change in the output voltage can be obtained for a varying current in a higher current range. Accordingly, the dimensions of the current-pulse duty conversion element 10 may be chosen in accordance with the range of the D.C. load current being determined. No particular modification is required in the arrangement of the circuit 100.

Figure 6A:
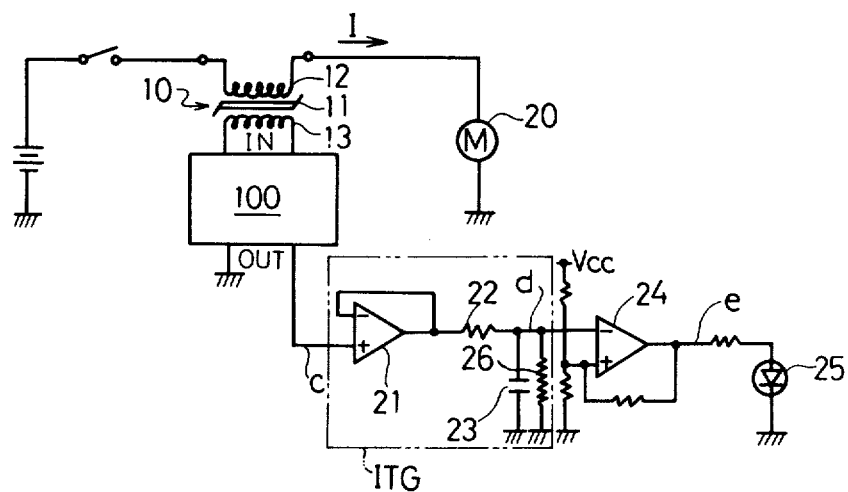
FIG. 6a is a circuit diagram of a motor load alarm circuit incorporating the D.C. current detector shown in FIG. 1.

FIG. 6a shows a load alarm circuit associated with a D.C. motor which utilizes the D.C. current detector of FIG. 1. Electrical signals appearing at various points in the circuit are illustrated in FIG. 6b. In this load alarm circuit, an integrating circuit ITG comprising a non-inverting amplifier 21, resistors 22, 26 and a capacitor 23 is connected to the output terminal 108 of the current detection circuit 100 of the D.C. current detector. An integrated voltage from the integrating circuit ITG is applied to an inverting input (−) of a comparator 24 while a reference voltage is applied to a non-inverting input (+) thereof. When the integrated voltage decreases below the reference voltage or when a high load current flows over a prolonged period of time, the comparator 24 produces a positive output, which permits a light emitting diode 25 to be energized.

FIG. 7 shows a load current control system incorporating the D.C. current detector of FIG. 1. A current is supplied to a load (not shown) from a D.C. power source through a current controller 25 and the first coil 12 of the conversion element 10. The load current is converted into an analog voltage by the detector (10, 100), and the analog voltage is applied to a comparator 26. When the input analog voltage exceeds a reference voltage Vref, the comparator 26 produces a low level or "0" control signal; while it produces a high level or "1" control signal if the input analog voltage is below the reference voltage Vref. The current controller 25 reduces the current supply in response to the "0" control signal and increases the current supply in response to the "1" control signal.

In addition to its use in the alarm control and current control applications mentioned above, the D.C. current detector of the present invention finds extensive applications in detecting abnormalities in the load current flowing through a generator, solenoid, or the like, as well as in detecting abnormalities in a D.C. power transmission bus. The rigidity of the current-pulse duty conversion element 10, as well as its construction, allows its connection anywhere in a load current circuit, and facilitates its use in the current detection of a D.C. motor or a D.C. generator mounted on a vehicle.

TABLE 1

| material, atomic weight percent | material & dimensions of core 11 of element 10 configuration single amorphous sheet | | coil 12 | | coil 13 | |
|---|---|---|---|---|---|---|
| | length | width | wire | number of turns | wire | number of turns |
| $Fe_{40}Ni_{40}P_{14}B_6$ amorphous alloy sheet, thickness = 0.058 mm | 20 mm | 1.8 mm | 0.12ϕ | 1000 | 0.7ϕ | 10 |

Figure 5:
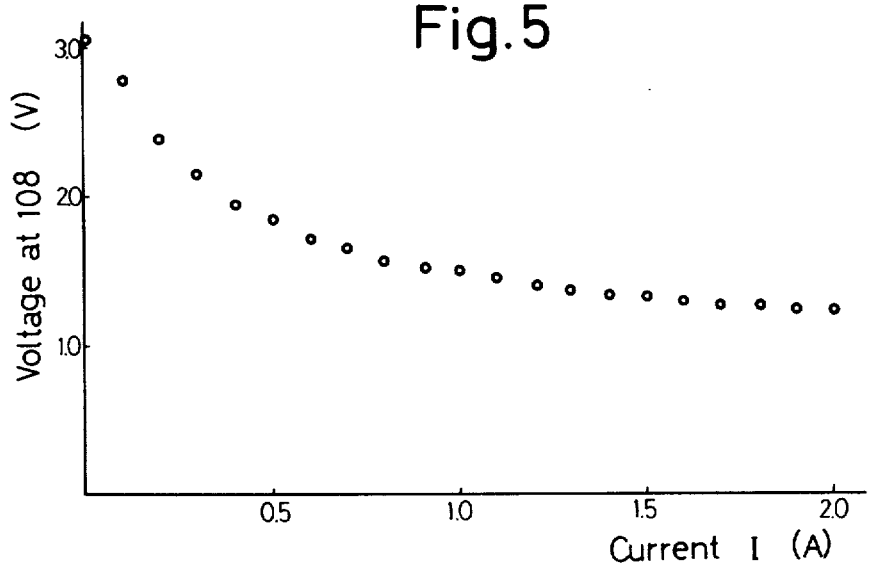
FIG. 5 graphically illustrates a detection output voltage (OUT) from the circuit of FIG. 1, plotted against the current I.

Referring to FIG. 5, the output voltage changes rapidly for a change in the D.C. load current I for $I \leq 0.5$ A with good linearity while the change is smaller for $I > 0.5$ A. This is mainly attributable to the construction of the core 11 which comprises a single narrow sheet of an amorphous material and to an increased number of turns in the coil 13. By increasing the number of sheets Obviously, numerous additional modifications and variations of the present invention are possible in light of the above teachings. It is therefore to be understood that within the scope of the appended claims, the invention may be practiced otherwise than an specifically described herein.

What is claimed as new and desired to be secured by Letters Patent of the United States is:

1. A D.C. current detector, comprising:
    a current-pulse duty conversion element including a core member of an amorphous magnetically soft material carrying first and second electrical coils disposed thereon, said first electrical coil having an unknown current to be detected flowing therethrough;
    pulse supply circuit means for applying a pulse signal to a first terminal of said second electrical coil;
    voltage conversion means connected to a second terminal of said second electrical coil for converting a current flowing through said second electrical coil into a corresponding voltage, said voltage conversion means consisting of a constant current source means connected to said second terminal for establishing a predetermined constant current value through said second electrical coil upon application of said pulse signal, wherein said constant current saturates said core member and produces a delayed voltage signal after a time delay related to the unknown current during the remaining duration of said pulse signal; and
    integrating circuit means coupled to said voltage conversion means for converting said delayed voltage signal into an output voltage, the amplitude of said output voltage being related to the amplitude of said unknown current, comprising,
    amplifier means connected to said second terminal of said second electrical coil for pulse shaping said delayed voltage signal, and
    means for integrating the pulse shaped delayed voltage signal to produce said output voltage.

2. A D.C. current detector as recited in claim 1, wherein said core comprises:
    a single sheet of amorphous magnetically soft material.

3. A D.C. current detector as recited in claim 1, wherein said core comprises:
    a plurality of sheets of amorphous magnetically soft material, said plurality of sheets being laminated together.

* * * * *